US006693331B2

(12) United States Patent
Mistry et al.

(10) Patent No.: US 6,693,331 B2
(45) Date of Patent: Feb. 17, 2004

(54) METHOD OF FABRICATING DUAL THRESHOLD VOLTAGE N-CHANNEL AND P-CHANNEL MOSFETS WITH A SINGLE EXTRA MASKED IMPLANT OPERATION

(75) Inventors: Kaizad R. Mistry, Lake Oswego, OR (US); Ian R. Post, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/443,056

(22) Filed: Nov. 18, 1999

(65) Prior Publication Data
US 2003/0094659 A1 May 22, 2003

(51) Int. Cl.[7] .............................................. H01L 29/76
(52) U.S. Cl. ................... 257/369; 257/269; 257/339; 257/351; 257/371; 257/376; 257/402
(58) Field of Search ............................... 257/268, 351, 257/369, 269, 371, 339, 376, 402

(56) References Cited

U.S. PATENT DOCUMENTS

| 4,532,696 | A | * | 8/1985 | Iwai ............................. 29/571 |
|---|---|---|---|---|
| 5,164,805 | A | * | 11/1992 | Lee ............................. 257/351 |
| 5,239,197 | A | * | 8/1993 | Yamamoto ..................... 257/500 |
| 5,254,487 | A | * | 10/1993 | Tamagawa ..................... 437/34 |
| 5,547,894 | A | * | 8/1996 | Mandelman et al. .......... 437/56 |
| 5,548,143 | A | * | 8/1996 | Lee ............................. 257/269 |
| 5,557,231 | A | * | 9/1996 | Yamaguchi et al. ........ 327/534 |
| 5,714,796 | A | * | 2/1998 | Chishiki ....................... 257/544 |
| 5,789,788 | A | * | 8/1998 | Ema et al. .................... 257/371 |
| 5,795,803 | A | * | 8/1998 | Takamura et al. ........... 438/228 |
| 5,827,763 | A | * | 10/1998 | Gardner et al. .............. 438/232 |
| 5,847,432 | A | * | 12/1998 | Nozaki ......................... 257/369 |
| 5,952,696 | A | * | 9/1999 | Gardner et al. .............. 257/369 |
| 5,963,799 | A | * | 10/1999 | Wu .............................. 438/199 |
| 6,090,652 | A | * | 7/2000 | Kim ............................. 438/228 |
| 6,111,427 | A | * | 8/2000 | Fujii et al. .................... 326/34 |
| 6,187,643 | B1 | * | 2/2001 | Borland ........................ 438/302 |
| 6,207,510 | B1 | * | 3/2001 | Abeln et al. ................. 438/276 |
| 6,287,912 | B1 | * | 9/2001 | Asukura et al. ............. 438/241 |
| 6,337,248 | B1 | * | 1/2002 | Imai ............................ 438/279 |
| 6,342,719 | B1 | * | 1/2002 | Arai ............................ 257/371 |
| 6,455,402 | B2 | * | 9/2002 | Lee et al. .................... 438/527 |
| 6,462,385 | B1 | * | 10/2002 | Kumagai ..................... 257/372 |

FOREIGN PATENT DOCUMENTS

| EP | 0614222 A1 | * | 2/1994 |
|---|---|---|---|
| EP | 10050860 | | 2/1998 |
| EP | 849801 | * | 6/1998 |
| EP | 11004004 | | 1/1999 |
| GB | 2 314974 | * | 1/1998 |
| GB | 2 314 974 A | | 1/1998 |
| GB | 2314974 | * | 1/1998 |
| JP | 8-204025 | * | 8/1996 |
| JP | 9-45792 | * | 2/1997 |
| JP | 10 50860 | * | 2/1998 |
| JP | 10 242292 | * | 9/1998 |
| JP | 11-4004 | | 1/1999 |

* cited by examiner

Primary Examiner—Nathan J. Flynn
Assistant Examiner—Ahmed N. Sefer
(74) Attorney, Agent, or Firm—Cyndi M. Wheeler

(57) ABSTRACT

A method of forming an MOS integrated circuit having at least two types of NFET, each type having a different threshold voltage, and at least two types of PFET, each type having a different threshold voltage, includes forming at least four active regions in a substrate, each region having a different doping profile. A conventional two threshold voltage CMOS process is modified to produce four transistor threshold voltages with only one additional masked implant operation. This additional implant raises the threshold voltage of one type of MOSFET while lowering that of the other MOSFET type.

5 Claims, 5 Drawing Sheets

US 6,693,331 B2

METHOD OF FABRICATING DUAL THRESHOLD VOLTAGE N-CHANNEL AND P-CHANNEL MOSFETS WITH A SINGLE EXTRA MASKED IMPLANT OPERATION

BACKGROUND OF THE INVENTION

1. Field of the Invention

The present invention relates generally to semiconductor manufacturing, and more particularly, the invention relates to complementary metal oxide semiconductor (CMOS) integrated circuits having at least two different threshold voltage n-channel field effect transistors (NFETs) and at least two different threshold p-channel field effect transistors (PFETs).

2. Background

Advances in semiconductor manufacturing technology have led to the integration of millions of circuit elements, such as transistors, on a single integrated circuit (IC). In order to integrate increasing numbers of circuit elements onto an integrated circuit it has been necessary to reduce the line widths of the various parts that make up an integrated circuit. Not only have interconnect line widths become smaller, but so have the dimensions of metal-oxide-semiconductor field effect transistors (MOSFETs).

MOSFETs are also sometimes referred to as insulated gate field effect transistors (IGFETs). Most commonly, these devices are referred to simply as FETs, and are so referred to herein.

Transistor scaling typically involves more than the linear reduction of the FET width and length. For example, both source/drain (S/D) junction depth and gate dielectric thickness are also typically reduced in order to produce a FET with the desired electrical characteristics. Additionally, as transistor dimensions scale down, the voltages at which they must operate are also be scaled down. Without scaling down supply voltages, the electric field imposed across the scaled down gate dielectric is increased, often leading to a rupture of the gate dielectric, and consequently leads to functional failure or reduced reliability of an integrated circuit. By scaling down the power supply voltages, the electric field across the gate dielectric is reduced thereby preventing damage due to electric field intensity. However, reduced supply voltages also reduces the gate drive and thereby reduces the obtainable circuit performance. To compensate for reduced gate drive in these scaled down integrated circuits it is common to also scale down the MOSFET threshold voltages.

Unfortunately, as the power supply voltage is scaled below, for example, 1.5 volts, the MOS transistor threshold voltage cannot be scaled to the same degree because of the undesirable off-state leakage current that occurs in low Vt (threshold voltage) transistors. Although the off-state current in a single transistor is not typically very large, integrated circuits such as microprocessors may have hundreds of millions of transistors and therefore it becomes extremely difficult to obtain low standby power consumption.

What is needed are transistors suitable for use in integrated circuits that provide high speed performance and low off state leakage currents.

SUMMARY OF THE INVENTION

Briefly, a method of forming an MOS integrated circuit having at least two types of NFET, each type having a different threshold voltage, and at least two types of PFET, each type having a different threshold voltage, includes forming at least four active regions in a substrate, each region having a different doping profile.

BRIEF DESCRIPTION OF THE DRAWINGS

FIG. 1 is a schematic cross-sectional view of a wafer having isolations structures formed therein and a first patterned mask layer thereon.

FIG. 2 is a schematic cross-sectional view of the structure of FIG. 1 after the first mask layer is removed and a second patterned mask layer is formed.

FIG. 3 is a schematic cross-sectional view of the structure of FIG. 2 after the second mask layer is removed and a third patterned mask layer is formed.

FIG. 4 is a schematic cross-sectional view of the structure of FIG. 3, after the third mask layer is removed and a fourth patterned mask layer is formed.

FIG. 5 is a schematic cross-sectional view of the structure of FIG. 4, after the fourth mask layer is removed, and further processing operations have been performed to produce low and high Vt NFETs and low and high Vt PFETs.

FIG. 6 is a schematic cross-sectional view of a wafer with isolation structures, and a first masking layer that covers two active regions, and exposes two active regions.

FIG. 7 is a schematic cross-sectional view of the structure of FIG. 6 after the two exposed active regions have received p-well and low Vt NFETs implants, the first masking layer has been removed, and a second masking layer has been formed that covers the regions that received the p-well and low Vt NFET implants.

FIG. 8 is a schematic cross-sectional view of the structure of FIG. 7 after an n-well and high Vt PFET implants have been performed, the second masking layer has been removed, and a third masking layer, which exposes at least one active region in the p-well area and at least one active region in the n-well area has been formed.

FIG. 9 is a schematic cross-sectional view of the structure of FIG. 8, after a p-type dopant is implanted, the third masking layer is removed, and FETs are formed on each of the at least four differently doped regions.

FIG. 10 is a schematic cross-sectional view of a wafer with isolation structures, and a first masking layer that covers two active regions, and exposes two active regions.

FIG. 11 is a schematic cross-sectional view of the structure of FIG. 10 after the two exposed active regions have received p-well and high Vt NFET implants, the first masking layer has been removed, and a second masking layer has been formed that covers the regions that received the p-well and high Vt NFET implants.

FIG. 12 is a schematic cross-sectional view of the structure of FIG. 11 after an n-well and low Vt PFET implants have been performed, the second masking layer has been removed, and a third masking layer, which exposes at least one active region in the p-well area and at least one active region in the n-well area has been formed.

FIG. 13 is a schematic cross-sectional view of the structure of FIG. 12, after an n-type dopant is implanted, the third masking layer is removed, and FETs are formed on each of the at least four differently doped regions.

DETAILED DESCRIPTION

Terminology

Figure 1:
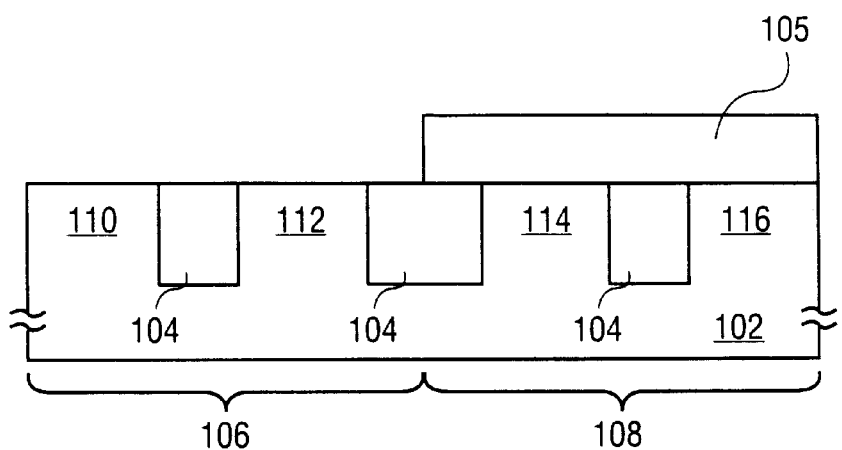
FIGS. 1 through 5 illustrate a conventional method of forming an integrated circuit with two types of NFETs each having a different threshold voltage, and two types of PFET each having a different threshold voltage.

The terms, chip, integrated circuit, monolithic device, semiconductor device, and microelectronic device, are often used interchangeably in this field. The present invention is applicable to all the above as they are generally understood in the field.

Historically, the material most commonly used in the semiconductor industry to form the gate insulator layer of a FET is silicon dioxide. Thus, the gate insulator layer is frequently referred to simply as the gate oxide. The expression gate dielectric is also used to describe the gate insulator layer.

The term "gate" is context sensitive and can be used in two ways when describing integrated circuits. Gate refers to a circuit for realizing an arbitrary logical function when used in the context of a logic gate. However, as used herein, gate refers to the insulated gate terminal of a three terminal FET when used in the context of transistor circuit configurations or formation of transistor structures. The expression "gate terminal" is generally interchangeable with the expression "gate electrode". A FET can be viewed as a four terminal device when the semiconductor body is considered, for the purpose of describing illustrative embodiments of the present invention, the FET will be described using the traditional gate-drain-source, three terminal model.

Polycrystalline silicon is a nonporous form of silicon made up of randomly oriented crystallites or domains. Polycrystalline silicon is often formed by chemical vapor deposition from a silicon source gas or other methods and has a structure that contains large-angle grain boundaries, twin boundaries, or both. Polycrystalline silicon is often referred to in this field as polysilicon, or sometimes more simply as poly.

Source/drain terminals refer to the terminals of a FET, between which conduction occurs under the influence of an electric field, subsequent to the inversion of the semiconductor surface under the influence of a vertical electric field resulting from a voltage applied to the gate terminal. Generally, the source and drain terminals are fabricated such that they are geometrically symmetrical. With geometrically symmetrical source and drain terminals it is common to simply refer to these terminals as source/drain terminals, and this nomenclature is used herein. Designers often designate a particular source/drain terminal to be a "source" or a "drain" on the basis of the voltage to be applied to that terminal when the FET is operated in a circuit.

As noted above, when power supply voltage is scaled down, MOSFET threshold voltages are also commonly scaled down. However, when the power supply voltage is scaled below 1.5 volts, scaling the transistor threshold voltage to the same degree can result in the undesirable off-state (i.e., subthreshold) leakage currents that occur in short channel low threshold voltage MOSFETs. Although the off-state current in a single transistor is not typically very large, integrated circuits such as microprocessors may contain hundreds of millions of transistors and therefore it becomes extremely difficult to obtain low standby power consumption.

One solution that has been suggested is to use dual threshold voltages for the NFETs and PFETs that make up a CMOS integrated circuit. That is, a CMOS integrated circuit would contain two types of NFET, rather than one, each having a different threshold voltage, and would further contain two types of PFET, rather than one, each having a different Vt. In this scheme, one type of NFET has a low Vt (high speed performance with high leakage current), and the second type of NFET has a high Vt (low speed performance with low leakage current). Similarly, in this scheme one type of PFET has a low Vt (high speed performance with high leakage current), and the second type of PFET has a high Vt (low speed performance with low leakage). NFET threshold voltage is referred to generally herein as Vtn, and PFET threshold voltage is referred to generally herein as Vtp.

As it turns out, in many integrated circuits, particularly logic devices, a relatively small percentage (e.g., 10–50%) of the transistors on a chip determine the overall performance of that chip. Circuit designers can selectively use low Vt transistors to increase speed performance, while using high Vt transistors for circuits where it is important to achieve lower leakage currents, or where speed is not important. In this manner, high speed performance is obtained without a severe penalty in power consumption. However, conventional semiconductor manufacturing processes use two extra masking operations and two extra ion implant operations so that the extra threshold voltages can be set in the various NFETs and PFETs of the integrated circuit.

FIGS. 1 through 5 illustrate a conventional method of forming an integrated circuit with two types of NFETs each having a different threshold voltage, and two types of PFET each having a different threshold voltage. In this conventional process, a wafer is processed such that a p-well is formed, and a low Vtn implant is done over the whole p-well. An n-well is then formed, and a low Vtp implant is done over the whole n-well. A mask layer is then patterned such that a portion of the p-well is exposed and a high Vtn implant is performed. The mask layer is removed and another mask layer is patterned such that a portion of the n-well is exposed a high Vtp implant is performed.

Referring to FIG. 1, a masking layer 105 is patterned over a wafer 102 having isolation structures 104 formed therein. The exposed portion 106 of wafer 102 is implanted with p-type dopants to form a p-well. Exposed portion 106 is further implanted with p-type dopants at a different dose and energy so as to set the surface doping concentration consistent with the subsequent formation of NFETs with a low threshold voltage.

Figure 2:
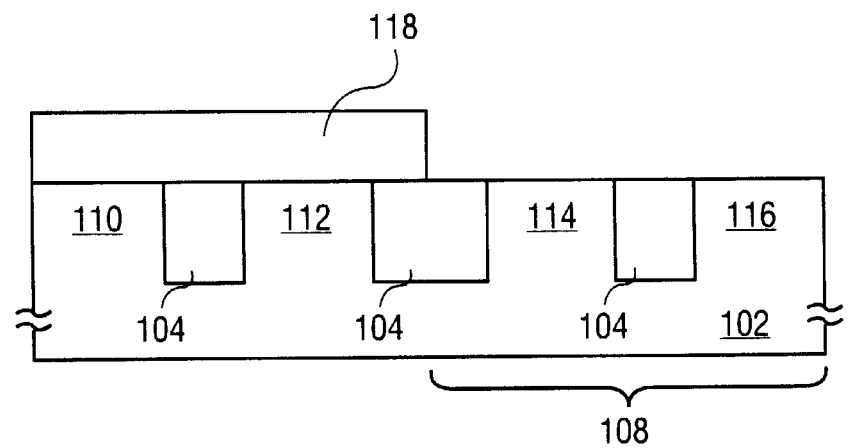

Referring to FIG. 2, masking layer 105 is removed, and masking layer 118 is patterned such that a portion 108 of wafer 102 is exposed. The exposed portion 108 is implanted with n-type dopants to form an n-well. Exposed portion 108 is further implanted with n-type dopants at a different dose and energy so as to set the surface doping concentration consistent with the subsequent formation of PFETs with a low threshold voltage.

Figure 3:
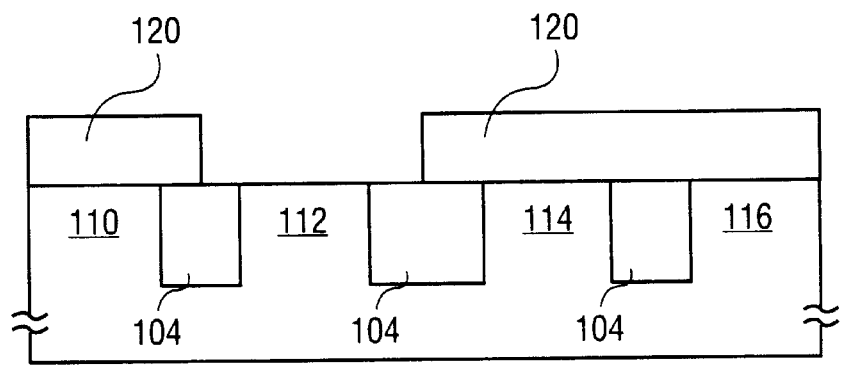

Referring to FIG. 3, masking layer 118 is removed and masking layer 120 is patterned on wafer 102 such that region 112 is exposed. Exposed portion 112 is then implanted with a p-type dopant to set the surface doping concentration consistent with the subsequent formation of NFETs with a high threshold voltage.

Figure 4:
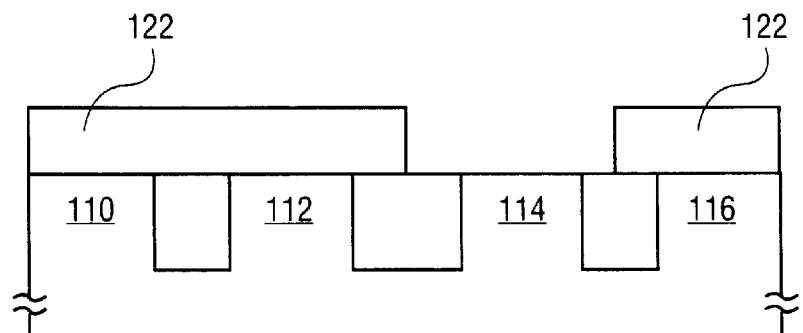

Referring to FIG. 4, masking layer 120 is removed and masking layer 122 is patterned on wafer 102 such that region 114 is exposed. Exposed portion 114 is then implanted with an n-type dopant to set the surface doping concentration consistent with the subsequent formation of PFETs with a high threshold voltage.

Figure 5:
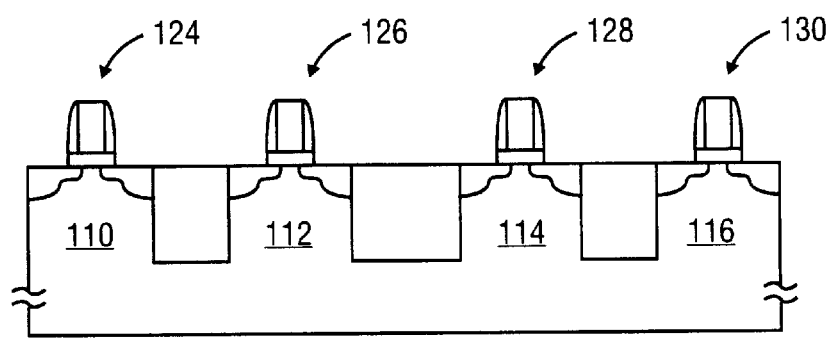

FIG. 5 is a schematic cross-sectional view of wafer 102 with a low Vt NFET formed in region 110, a high Vt NFET formed in region 112, a high Vt PFET formed in region 114, and a low Vt PFET formed in region 116.

Table 1 shows the various implants received by regions 110, 112, 114, and 116 which are the low Vtn, high Vtn, high Vtp, and low Vtp regions respectively.

TABLE 1

|            | p-well | Low Vtn | High Vtn | n-well | Low Vtp | High Vtp |
|------------|--------|---------|----------|--------|---------|----------|
| Region 110 | ✓      | ✓       |          |        |         |          |
| Region 112 | ✓      | ✓       | ✓        |        |         |          |
| Region 114 |        |         |          | ✓      | ✓       |          |
| Region 116 |        |         |          | ✓      | ✓       | ✓        |

Methods of forming a dual threshold voltage CMOS integrated circuit with use of only one extra masking and implant operation in accordance with the present invention are disclosed below.

Figure 6:
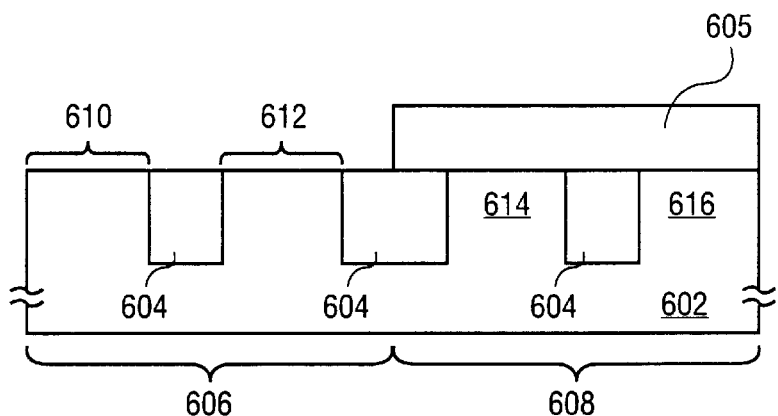
FIGS. 6 through 9 illustrate a method, in accordance with the present invention, of forming an integrated circuit with two types of NFETs each having a different threshold voltage, and two types of PFET each having a different threshold voltage.

An element of one embodiment of the present invention is that the same implant that is used to raise the threshold of a low Vt NFET, is also used to lower the Vt of a high Vt PFET. The process flow for such an embodiment is described with reference to FIGS. 6–9. FIG. 6 shows a schematic cross-section of a partially processed wafer 602, having shallow trench isolation structures 604, and a patterned photoresist layer 605 overlying a portion of wafer 602. The formation of isolation structures 604 is accomplished by way of well-known processing operations. FIG. 6 further shows six regions 606, 608, 610, 612, 614, and 616 of wafer 602. Region 606 is where a p-well is to be formed, region 608 is where an n-well is to be formed, region 610 is where a low Vt NFET is to be formed, region 612 is where a high Vt NFET is to be formed, region 614 is where a high Vt PFET is to be formed, and region 616 is where a low Vt PFET is to be formed. Regions 610, 612, 614, and 616 are sometimes referred to as active regions. This is to distinguish these regions from other portions of a wafer wherein isolation structures are disposed on or in the surface of the wafer. A p-well may have one or more active regions therein. Similarly, an n-well may have one or more active region therein.

Region 606 becomes p-well 606 by the implantation of p-type dopants. Photoresist 605 blocks this p-well implant from region 608. Those skilled in the art will recognize that although a photoresist is described in illustrative embodiment, other materials may be used as a masking layer. The requirement for this masking layer is that is be able to block ion implantation at the dose and energy used for p-well formation and threshold adjustment.

Still referring to FIG. 6, a second p-type implant, with a dose and energy different from that of the p-well implant, is made into region 606, which includes regions 610, 612. This additional implant, referred to as the low Vt NFET implant, modifies the doping profile close to the surface of wafer 602 in regions 610 and 612. Such an implant may be referred to as a threshold adjusting implant since it will strongly affect the threshold voltage of a field effect transistor formed in the region of this implant. In this illustrative embodiment of the present invention, this threshold adjusting implant is targeted to produce low Vt NFETs, even though it is made into both low Vt NFET region 610 and high Vt NFET region 612. The low Vt NFET (Vtn) implant species may be $B^{11}$ at doses in the range of approximately $1 \times 10^{12}$ to $1 \times 10^{13}$ ions per square centimeter, at an energy of approximately 10 KeV to 50 KeV. Alternatively, the low Vtn implant species may be $BF_2$ or Indium with similar doses.

Figure 7:
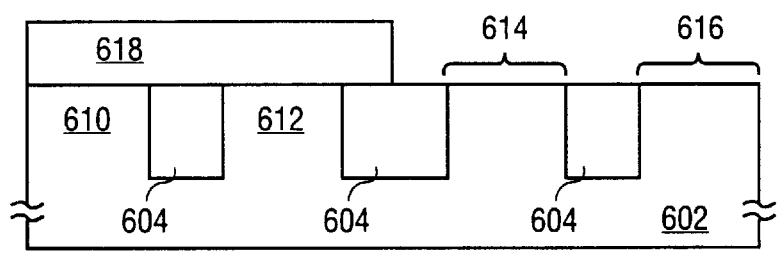

FIG. 7 shows a schematic cross-sectional view of the structure of FIG. 6, after further processing in which photoresist 605 is removed, and a patterned photoresist 618 is formed. As discussed above, photoresist 618 may alternatively be a masking layer of any material that is suitable for integration in the semiconductor manufacturing process and that is capable of blocking the n-well and PFET threshold adjustment implants. Photoresist 618 covers regions 610 and 612, while regions 614 and 616 remain exposed. Subsequent to the formation of photoresist 618, an n-well implant and a high Vt PFET (Vtp) implant are performed. The formation of n-wells is well-known in this field. The n-well implant is achieved by implanting an n-type dopant such as arsenic, phosphorus, or antimony. The high Vtp implant similarly consists of an n-type ion implantation. For example, an arsenic implant at a dose in the range of approximately $1 \times 10^{12}$ to $1 \times 10^{13}$ ions per square centimeter, and an energy of approximately 50 KeV to 200 KeV may be used. Photoresist 618 is then removed. Those skilled in the art will appreciated that other n-type dopants such as phosphorus or antimony may be used.

Figure 8:
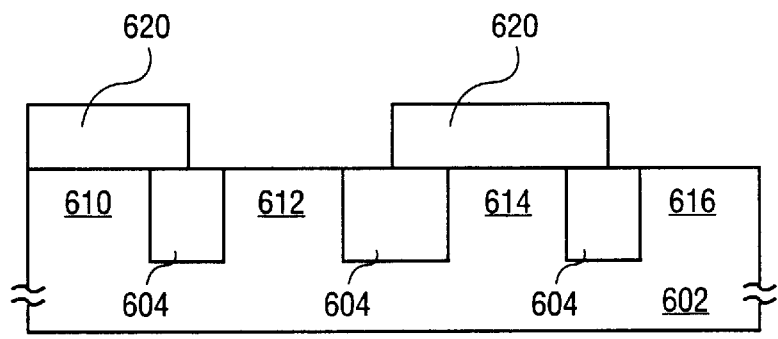

FIG. 8 shows a schematic cross-sectional view of the structure of FIG. 7, after further processing in which photoresist 618 is removed, and a patterned photoresist 620 is formed. As discussed above, photoresist 620 may alternatively be a masking layer of any material that is suitable for integration in the semiconductor manufacturing process and that is capable of blocking threshold adjustment implants. Photoresist 620 covers regions 610 and 614, while regions 612 and 616 remain exposed. Subsequent to the formation of photoresist 620 a p-type dopant is implanted into regions 612 and 616. In this way, the threshold voltage of NFETs formed in region 612 (the high Vt NFET region) will be raised, and the threshold voltage of PFETs formed in region 616 (the low Vt PFET region) will be lowered. The high Vtn implant may, for example, be $B^{11}$ at a dose in the range of approximately $5 \times 10^{12}$ to $5 \times 10^{13}$ ions per square centimeter, and an energy of approximately 10 KeV to 50 KeV. Again, other p-type dopants such as $BF_2$ or Indium may be used for the threshold adjustment implant. It can be understood from the above, that the effective doping concentration of region 610, is determined by the p-well and low Vtn implants, the effective doping concentration of region 612 is determined by the p-well, low Vtn, and high Vtn implants, the effective doping concentration of region 614 is determined by the n-well and high Vtp implants, and the effective doping concentration of region 616 is determined by the n-well, high Vtp, and high Vtn implants. Those skilled in the art will recognize that wafer 602 typically has some initial doping concentration. This doping may be p-type or n-type, and may be substantially uniform throughout wafer 602, or may have a first concentration near the surface and a different concentration in the bulk of the wafer.

Figure 9:
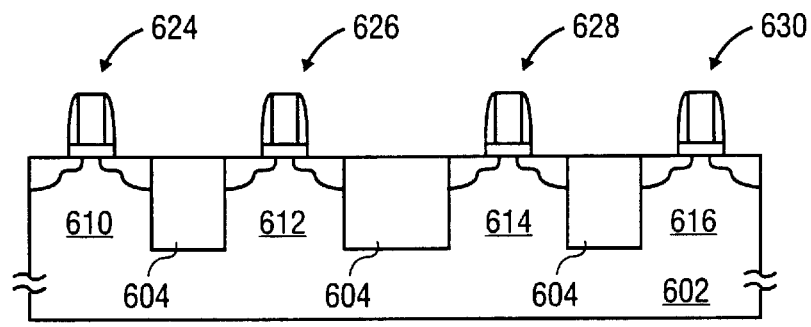

FIG. 9 shows a schematic cross-sectional view of the structure of FIG. 8, after further processing in which photoresist 620 is removed, and conventional processing operations are used to form NFETs 624, 626 and PFETs 628, 630. NFET 624 is formed in region 610, NFET 626 is formed in region 612, PFET 628 is formed in region 614, and PFET 630 is formed in region 616. The doping concentrations in regions 610, 612, 614, and 616, strongly affect the threshold voltages of NFETs 624, 626 and PFETs 628, 630 respectively. More particularly, CMOS integrated circuits having four transistor thresholds are obtained (two NFET thresholds and two PFET thresholds) with five implants and three mask operations which determine the threshold voltages. Conventional processes which produce CMOS integrated circuits having four transistor thresholds require six implants and four mask operations to determine the threshold voltages.

Table 2 shows the various implants received by regions 610, 612, 614, and 616 which are the low Vtn, high Vtn, high Vtp, and low Vtp regions respectively.

TABLE 2

|  | p-well | Low Vtn | High Vtn | n-well | Low Vtp | High Vtp |
|---|---|---|---|---|---|---|
| Region 610 | ✓ | ✓ |  |  |  |  |
| Region 612 | ✓ | ✓ | ✓ |  |  |  |
| Region 614 |  |  |  | ✓ |  | ✓ |
| Region 616 |  |  | ✓ | ✓ | ✓ |  |

One potential concern with the embodiment of the present invention illustrated in FIGS. 6–9, is that since the low Vt PFET has a compensated channel implant scheme, its performance will be reduced in view of increased ionized impurity scattering. However, this is not a major disadvantage for at least the following three reasons. First, for domino logic, circuit performance depends more on NFET performance than on PFET performance. Second, for aggressively scaled high performance technologies, mobility, and therefore performance are limited mostly by surface roughness scattering and the effect of increased ionized impurity scattering will be relatively small. Third, some aggressively scaled high performance technologies use some form of nitrided gate oxide, which introduces fixed positive charge to the gate dielectric. In view of this fixed charge, the PFET channel doping is reduced to compensate, and reduced channel doping leads to a lower net ionized impurity scattering.

FIGS. 10–13 illustrate an alternative method, in accordance with the present invention, of forming an integrated circuit with two types of NFETs each having a different threshold voltage, and two types of PFET each having a different threshold voltage.

Figure 10:
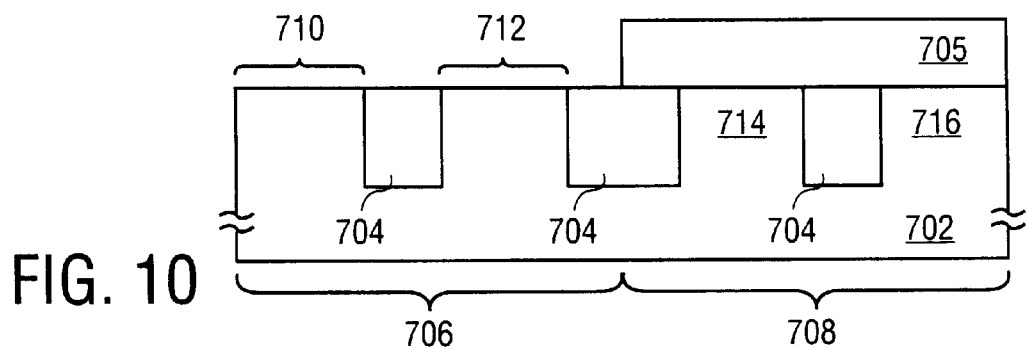
FIGS. 10 through 13 illustrate an alternative method, in accordance with the present invention, of forming an integrated circuit with two types of NFETs each having a different threshold voltage, and two types of PFET each having a different threshold voltage.

In this alternative embodiment of the present invention, the same implant that is used to raise the threshold of a low Vt PFET, is also used to lower the Vt of a high Vt NFET. The process flow for such an embodiment is described with reference to FIGS. 10–13. FIG. 10 shows a schematic cross-section of a partially processed wafer 702, having shallow trench isolation structures 704, and a patterned photoresist layer 705 overlying a portion of wafer 702. The formation of isolation structures 704 is accomplished by way of well-known processing operations. FIG. 10 further shows six regions 706, 708, 710, 712, 714, and 716 of wafer 702. Region 706 is where a p-well is to be formed, region 708 is where an n-well is to be formed, region 710 is where a low Vt NFET is to be formed, region 712 is where a high Vt NFET is to be formed, region 714 is where a high Vt PFET is to be formed, and region 716 is where a low Vt PFET is to be formed. Region 706 becomes p-well 706 by the implantation of p-type dopants. Photoresist 705 blocks this p-well implant from region 708.

Still referring to FIG. 10, a second p-type implant, with a dose and energy different from that of the p-well implant, is made into region 706, which includes regions 710, 712. This additional implant, referred to as the high Vt NFET implant, modifies the doping profile close to the surface of wafer 702 in regions 710 and 712. In this illustrative embodiment of the present invention, this threshold adjusting implant is targeted to produce high Vt NFETs, even though it is made into both low Vt NFET region 710 and high Vt NFET region 712. Such an implant could typically be $B^{11}$ at a dose in the range of approximately $1 \times 10^{12}$ to $1 \times 10^{13}$ ions per square centimeter, at an energy of approximately 10 KeV to 50 KeV. Alternatively, $BF_2$ or indium may be implanted. Those skilled in the art will appreciate that various p-type species, doses, and energies may be used to achieve the desired threshold voltage adjustment.

Figure 11:
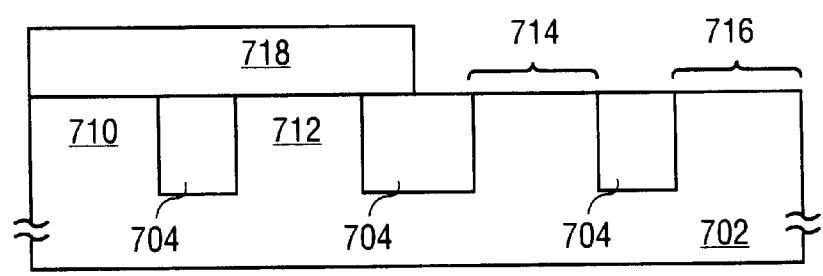

FIG. 11 shows a schematic cross-sectional view of the structure of FIG. 10, after further processing in which photoresist 705 is removed, and a patterned photoresist 718 is formed. Photoresist 718 may alternatively be a masking layer of any material that is suitable for integration in the semiconductor manufacturing process and that is capable of blocking the n-well and PFET threshold adjustment implants. Photoresist 718 covers regions 710 and 712, while regions 714 and 716 remain exposed. Subsequent to the formation of photoresist 718, an n-well implant and a low Vt PFET implant are performed. The n-well implant is achieved by implanting an n-type dopant such as arsenic, or phosphorus. Antimony is also an n-type dopant. The low Vt PFET implant similarly consists of an n-type ion implantation. For example, arsenic at a dose of approximately $1 \times 10^{12}$ to $1 \times 10^{13}$ ions per square centimeter, and an energy of approximately 50 KeV to 200 KeV. Those skilled in the art will appreciate that n-type dopants such as phosphorus or antimony may be used for threshold adjustment implants. Photoresist 718 is then removed.

Figure 12:
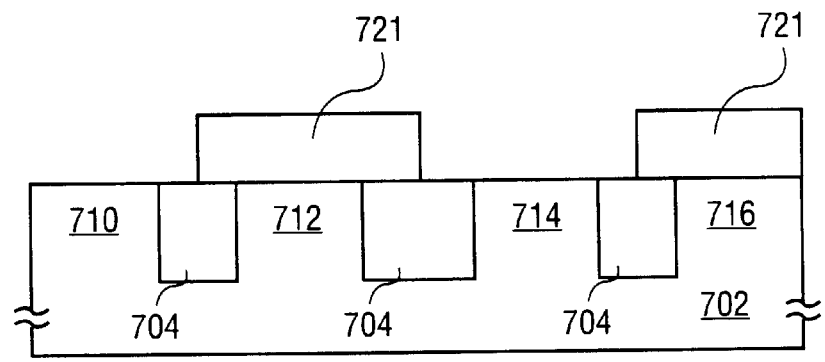

FIG. 12 shows a schematic cross-sectional view of the structure of FIG. 11, after further processing in which photoresist 718 is removed, and a patterned photoresist 721 is formed. Photoresist 721 may alternatively be a masking layer of any material that is suitable for integration in the semiconductor manufacturing process and that is capable of blocking an n-type threshold adjustment implant. Photoresist 721 covers regions 712 and 716, while regions 710 and 714 remain exposed. Subsequent to the formation of photoresist 721, an n-type dopant is implanted into regions 710 and 714. In this way, the threshold voltage of NFETs formed in region 710 (the low Vt NFET region) will be lowered, and the threshold voltage of PFETs formed in region 714 (the high Vt PFET region) will be raised. The high Vtp implant may, for example, be arsenic at a dose of approximately $1 \times 10^{12}$ to $1 \times 10^{13}$ ions per square centimeter, and an energy of approximately 50 KeV to 200 KeV. Those skilled in the art will appreciate that phosphorus and antimony are also n-type dopants.

It can be understood from the above, that the effective doping concentration of region 710, is determined by the p-well, high Vtn, and high Vtp implants, the effective doping concentration of region 712 is determined by the p-well, and high Vtn implants, the effective doping concentration of region 714 is determined by the n-well, low Vtp, and high Vtp implants, and the effective doping concentration of region 716 is determined by the n-well, and low Vtp implants. Those skilled in the art will recognize that wafer 702 typically has some initial doping concentration. This doping may be p-type or n-type, and may be substantially uniform throughout wafer 702, or may have a first concentration near the surface and a different concentration in the bulk of the wafer.

Figure 13:
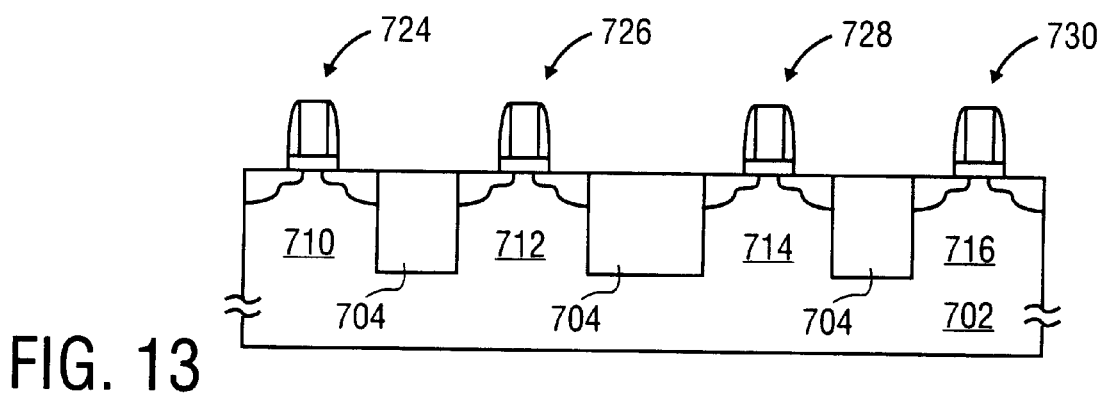

FIG. 13 shows a schematic cross-sectional view of the structure of FIG. 12, after further processing in which photoresist 721 is removed, and conventional processing operations are used to form NFETs 724, 726 and PFETs 728, 730. NFET 724 is formed in region 710, NFET 726 is formed in region 712, PFET 728 is formed in region 714, and PFET 730 is formed in region 716. The doping concentrations in regions 710, 712, 714, and 716, strongly affect the threshold voltages of NFETs 724, 726 and PFETs 728, 730 respectively. More particularly, CMOS integrated circuits having four transistor thresholds are obtained (two NFET thresholds and two PFET thresholds) with five implants and three mask operations which determine the threshold voltages. Conventional processes which produce CMOS integrated circuits having four transistor thresholds require six implants and four mask operations to determine the threshold voltages.

Table 3 shows the various implants received by regions 710, 712, 714 and 716, which are the low Vtn, high Vtn, high Vtp, and low Vtp regions respectively.

TABLE 3

|  | p-well | Low Vtn | High Vtn | n-well | Low Vtp | High Vtp |
|---|---|---|---|---|---|---|
| Region 710 | ✓ |  | ✓ |  |  | ✓ |
| Region 712 | ✓ |  | ✓ |  |  |  |
| Region 714 |  |  |  | ✓ | ✓ | ✓ |
| Region 716 |  |  |  |  | ✓ | ✓ |

Those skilled in the art will recognize that ion implantation operations other than those described above may be performed in the construction of MOSFETs. For example, source/drain extension and deep source/drain implants may be performed to produce the MOSFET source/drain terminals. However, the implants discussed in detail above, are the ones predominantly responsible for determination of the transistor threshold voltages.

Conclusion

Dual threshold voltage MOSFETs are helpful in maintaining relationship between performance improvements and physical transistor dimension scaling, as the power supply voltage is reduced. Embodiments of the present invention provide integrated circuits having high and low threshold voltage NFETs, and high and low threshold voltage PFETs.

An advantage of embodiments of the present invention is that integrated circuits having high and low threshold voltage NFETs, and high and low threshold voltage PFETs can be fabricated with only one additional masking and ion implant operation as compared to conventional methods of fabricating dual Vt CMOS integrated circuits which require two additional masking and ion implant operations.

The present invention may be implemented with various changes and substitutions to the illustrated embodiments. For example, the present invention may be practiced with not only with silicon wafers as substrates, but also with other substrates, including but not limited to such substrates as silicon on insulator (SOI).

Although specific embodiments, including specific equipment, parameters, methods and materials have been described, it will be readily understood by those skilled in the art and having the benefit of this disclosure, that various other changes in the details, materials, and arrangements of the materials and steps which have been described and illustrated in order to explain the nature of this invention may be made without departing from the principles and scope of the invention as expressed in the subjoined claims.

What is claimed is:

1. A microelectronic device, comprising:

a first NFET and a second NFET, the first NFET having a threshold voltage that is lower than the threshold voltage of the second NFET, each NFET having a channel region;

a first PFET and a second PFET, the first PFET having a threshold voltage that is lower than the threshold voltage of the second PFET, each PFET having a channel region;

a first NFET channel region having a first concentration of a p-type dopant and a second concentration of a p-type dopant therein;

a second NFET channel region having a first concentration of a p-type dopant, a second concentration of a p-type dopant, and a third concentration of a p-type dopant therein;

a second PFET channel region having a first concentration of an n-type dopant and a second concentration of an n-type dopant therein; and a first PFET channel region having a first concentration of an n-type dopant, a second concentration of an n-type dopant, and a third concentration of a p-type dopant therein.

2. The microelectronic device of claim 1, wherein the p-type dopant is selected from the group consisting of boron, $BF_2$, and indium.

3. The microelectronic device of claim 1, wherein the n-type dopant is selected from the group consisting of arsenic, phosphorous, and antimony.

4. The microelectronic device of claim 1, wherein the p-type dopant is boron, and the n-type dopant is arsenic.

5. A microelectronic device, comprising:

a first NFET and a second NFET, the first NFET having a threshold voltage that is lower than the threshold voltage of the second NFET, each NFET having a channel region;

a first PFET and a second PFET, the first PFET having a threshold voltage that is lower than the threshold voltage of the second PFET, each PFET having a channel region;

a first NFET channel region having a first concentration of a p-type dopant, a second concentration of a p-type dopant, and a third concentration of an n-type dopant therein;

a second NFET channel region having a first concentration of a p-type dopant and second concentration of a p-type dopant therein;

a second PFET channel region having a first concentration of an n-type dopant, a second concentration of an n-type dopant, and a third concentration of an n-type dopant therein; and a first PFET channel region having a first concentration of an n-type dopant and a second concentration of an n-type dopant therein.

* * * * *